US009425196B1

(12) United States Patent
Cheng et al.

(10) Patent No.: US 9,425,196 B1
(45) Date of Patent: Aug. 23, 2016

(54) MULTIPLE THRESHOLD VOLTAGE FINFETS

(71) Applicant: International Business Machines Corporation, Armonk, NY (US)

(72) Inventors: Kangguo Cheng, Schenectady, NY (US); Ramachandra Divakaruni, Ossining, NY (US); Juntao Li, Cohoes, NY (US); Fee Li Lie, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/961,933

(22) Filed: Dec. 8, 2015

(51) Int. Cl.
*H01L 21/8238* (2006.01)
*H01L 27/088* (2006.01)
*H01L 29/10* (2006.01)
*H01L 29/161* (2006.01)
*H01L 21/8234* (2006.01)

(52) U.S. Cl.
CPC .... *H01L 27/0886* (2013.01); *H01L 21/823412* (2013.01); *H01L 21/823418* (2013.01); *H01L 21/823431* (2013.01); *H01L 29/1054* (2013.01); *H01L 29/161* (2013.01)

(58) Field of Classification Search
CPC ................ H01L 21/823431; H01L 27/0886; H01L 27/10826; H01L 29/41791; H01L 29/66795; H01L 29/785; H01L 29/161; H01L 2224/27848
USPC .......... 257/288, 368, 369; 438/158, 197, 199, 438/663, 589
See application file for complete search history.

(56) References Cited

U.S. PATENT DOCUMENTS

| 6,380,590 | B1 | 4/2002 | Yu |
| 7,300,837 | B2 | 11/2007 | Chen et al. |
| 7,382,023 | B2 | 6/2008 | Chen et al. |
| 2012/0292715 | A1* | 11/2012 | Hong ............... H01L 21/845 257/392 |
| 2013/0049138 | A1* | 2/2013 | Zhu ............... H01L 21/823431 257/401 |
| 2014/0284722 | A1 | 9/2014 | Arghavani et al. |
| 2014/0306317 | A1* | 10/2014 | Licausi ............ H01L 21/30625 257/506 |
| 2014/0363960 | A1 | 12/2014 | Kim et al. |
| 2014/0377944 | A1 | 12/2014 | Kuo et al. |
| 2015/0054120 | A1 | 2/2015 | Bhuwalka et al. |

FOREIGN PATENT DOCUMENTS

| CN | 103681326 A | 3/2014 |
| CN | 104425384 A | 3/2015 |
| JP | 2006165435 A | 6/2006 |
| WO | 2010068530 A2 | 6/2010 |

* cited by examiner

*Primary Examiner* — Jarrett Stark
*Assistant Examiner* — Shahed Ahmed
(74) *Attorney, Agent, or Firm* — Andrew G. Wakim; Bryan Bortnick

(57) ABSTRACT

A method of forming a plurality of fins having different threshold voltages from a single semiconductor layer without channel doping. The method may include; forming a first semiconductor having a uniform thickness in an unmerged region, a first merged region, and a second merged region; recessing the first semiconductor in the first and second merged regions, the first semiconductor has a different thickness in each of the unmerged region, the first merged region, and the second merged region; forming a second semiconductor on the first semiconductor in the first and second merged regions; merging the first and second semiconductors to form a first merged semiconductor in the first merged region and a second merged semiconductor in the second merged region; and forming fins in unmerged region, the first merged region, and the second merged region.

18 Claims, 4 Drawing Sheets

MULTIPLE THRESHOLD VOLTAGE FINFETS

BACKGROUND

The present invention generally relates to semiconductor device manufacturing, and more particularly to the formation of multiple FinFETs having different threshold-voltages (Vt).

Complementary metal oxide semiconductor (CMOS) devices exhibit a threshold voltage (Vt). A voltage applied to the gate of a device (gate voltage) that equals or exceeds the threshold voltage induces a low resistance conductive path between the source and drain regions of the device. While a gate voltage that is below the threshold voltage results in little or no conductive path between the source and drain regions.

In electronic circuits, devices with different threshold voltages are used to realize circuit function. Previous methods of fabricating multiple devices with different threshold voltages included implanting different types of substrate dopants for FET devices that result in different threshold voltages.

SUMMARY

According to one embodiment of the present invention, a method is provided. The method may include providing a first semiconductor layer in a plurality of regions, wherein the first semiconductor layer has a starting thickness across the plurality of regions; recessing the first semiconductor layer in a first recessed region, wherein the first semiconductor layer has a first recessed thickness in the first recessed region; recessing the first semiconductor layer in a second recessed region, wherein the first semiconductor layer has a second recessed thickness in the second recessed region, and the second recessed thickness is less than the first recessed thickness; forming a second semiconductor layer on the first semiconductor layer in the first recessed region and in the second recessed region; merging the first semiconductor layer and the second semiconductor layer in regions having the second semiconductor layer, wherein a first merged semiconductor is formed in the first recessed region and a second merged semiconductor is formed in the second recessed region; and forming first concentration fins from the first merged semiconductor and second concentration fins from the second merged semiconductor.

According to another embodiment of the present invention, a structure is provided. The structure may include an insulator layer on a substrate in a plurality of fin regions, wherein the plurality of fin regions includes at least an unmerged region, a first region, and a second region; a first set of fins in the first region, the first set of fins are on a top surface of the insulator layer, and the first set of fins include SiGe; a second set of fins in the second region, the second set of fins are on the top surface of the insulator layer, the second set of fins include SiGe, wherein the second set of fins have a different germanium concentration than the first set of fins, and the second set of fins have a different threshold voltage than the first set of fins; and an unmerged set of fins in the unmerged region, the unmerged set of fins are on the top surface of the insulator layer, the unmerged set of fins include silicon, and the unmerged set of fins have a different threshold voltage than the first set of fins and the second set of fins.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
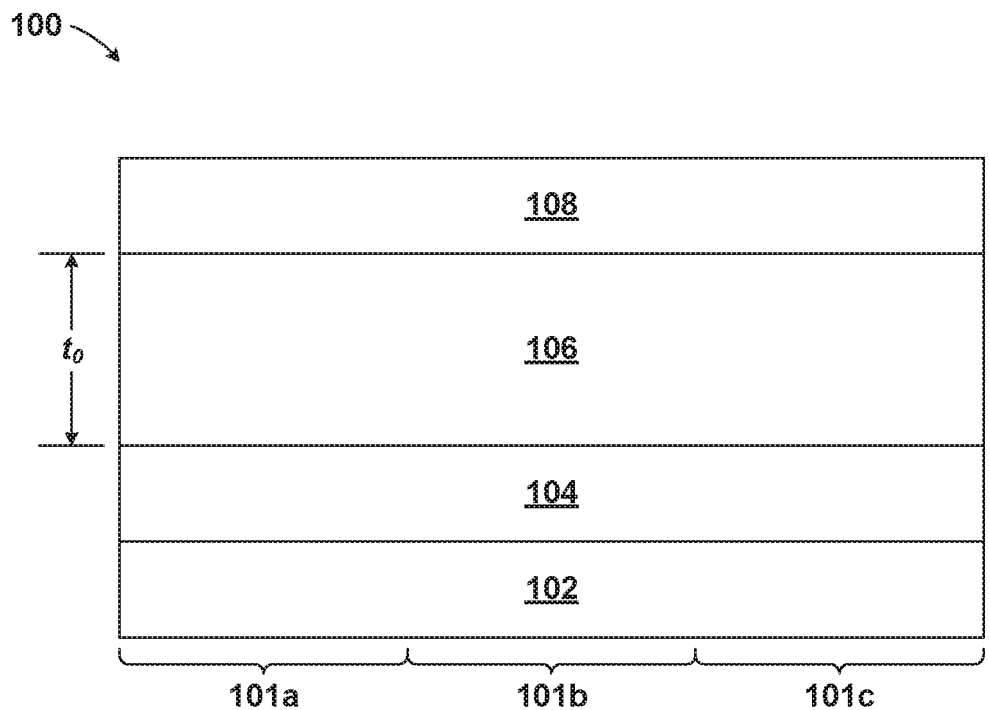
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation of multiple FinFETs having different threshold-voltages (Vt). One way to fabricate multiple FinFETs having different threshold-voltages is by forming a silicon (Si) layer in multiple regions, recessing a portion of the Si layer in one or more layers, forming a silicon germanium (SiGe) layer on the recessed portion of the Si layer, and merging the Si layer and SiGe layer to create a region with a higher or lower Ge concentration than that of one or more other region. One embodiment by which to form Si and SiGe FinFETs having different threshold-voltages is described in detail below referring to the accompanying drawings FIGS. 1-8.

With reference to FIG. 1, a demonstrative illustration of a structure 100 is provided during an intermediate step of a method of fabricating FinFETs with different threshold voltages, according to an embodiment. More specifically, the method can start with a first mask 108 on a semiconductor-on-insulator (SOI) substrate. The structure 100 may include a plurality of regions. In the illustrated embodiment, the structure 100 includes three regions, including; a first region 101a, a second region 101b, and a third region 101c.

The SOI substrate may include (from bottom to top) a substrate 102, an insulator layer 104, and a first semiconductor layer 106. The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. The substrate 102 may include, for example; an n-type, p-type, or undoped semiconductor material and may have a monocrystalline, polycrystalline, or amorphous structure. In an embodiment, the substrate 102 is a bulk silicon substrate.

The insulator layer 104 may be formed on the substrate 102 using any process technique known in the art, such as, for example, thermal oxidation, chemical vapor deposition (CVD), or atomic layer deposition (ALD). The insulator layer 104 may be any dielectric material known in the art, such as, for example, an oxide or nitride. The insulator layer 104 may also be referred to as a buried dielectric layer or a buried oxide (BOX) layer.

The first semiconductor layer 106 may be formed on the insulator layer 104 using any deposition technique known in the art, such as, for example, epitaxial growth. The first semiconductor layer 106 may be any semiconductor material known in the art, such as, for example, silicon, germanium, or SiGe. In an embodiment, the first semiconductor layer 106 is Si and may be referred to as a Si layer or a starting layer. The first semiconductor layer 106 may have a starting thickness $t_0$ in the first, second, and third regions 101a, 101b, 101c ranging from about 1 nm to about 200 nm, but other thicknesses may be used. In an embodiment, the starting thickness $t_0$ is about 40 nm.

The first mask 108 may be formed on the first semiconductor layer 106 using any deposition technique known in the art, such as, for example, chemical vapor deposition, plasma enhanced chemical vapor deposition, atomic layer deposition, or physical vapor deposition. The first mask 108 may include any masking material known in the art, such as, for example, silicon nitride ($Si_3N_4$), silicon carbide (SiC), silicon carbon nitride (SiCN), hydrogenated silicon carbide (SiCH), or any other masking material. In an embodiment, the first mask 108 is a silicon nitride.

The following figures will illustrate one method of fabricating sets of fins in each of the three regions having different threshold voltages. The illustrated embodiment will include the steps of thinning the first semiconductor layer 106 to have a different thickness in each of the three regions and merging the first semiconductor layers 106 with a semiconductor material having a different composition.

Figure 2:
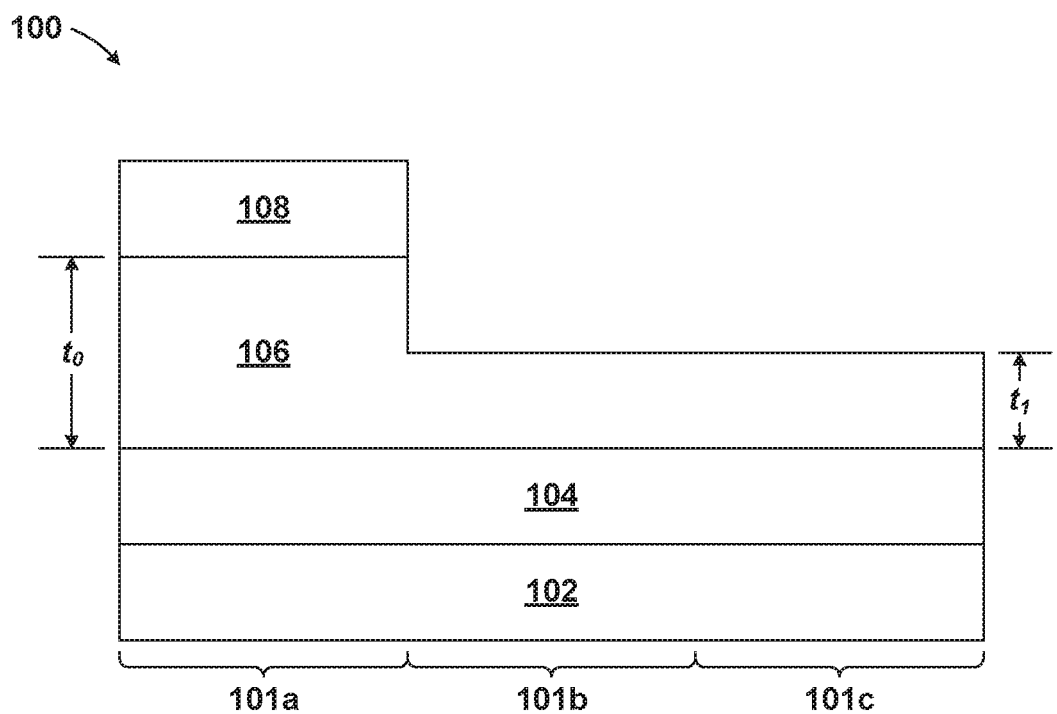
FIG. 2 is a cross section view of the semiconductor structure and illustrates the recessing of a first semiconductor layer in a second region and a third region.

With reference to FIG. 2, a demonstrative illustration of the structure 100 is provided during an intermediate step of a method of fabricating FinFETs with different threshold voltages, according to an embodiment. More specifically, the method can include recessing the first semiconductor layer 106 in the second and third regions 101b, 101c.

A top surface of the first semiconductor 106 in the second and third regions 101b, 101c may be exposed by patterning the first mask 108. The first mask 108 may be patterned using any patterning or layer removal technique known in the art, such as, for example, a reactive ion etch (RIE) and/or photolithography.

The first semiconductor layer 106 may be recessed in the second and third regions 101b, 101c using any etching technique known in the art, such as, for example, a reactive ion etch (RIE). The etching technique may etch the first semiconductor layer 106 selective to the first mask 108, such that the first mask 108 protects the first semiconductor layer 106 in the first region 101a. After the first semiconductor layer 106 is recessed, the first semiconductor layer 106 will have a first recessed thickness ($t_1$) in the second and third regions 101b, 101c. The first recessed thickness ($t_1$) can range from about 1 nm to about 200 nm, however, other thicknesses may be used. In an embodiment, the first recessed thickness ($t_1$) is about 20 nm.

Figure 3:
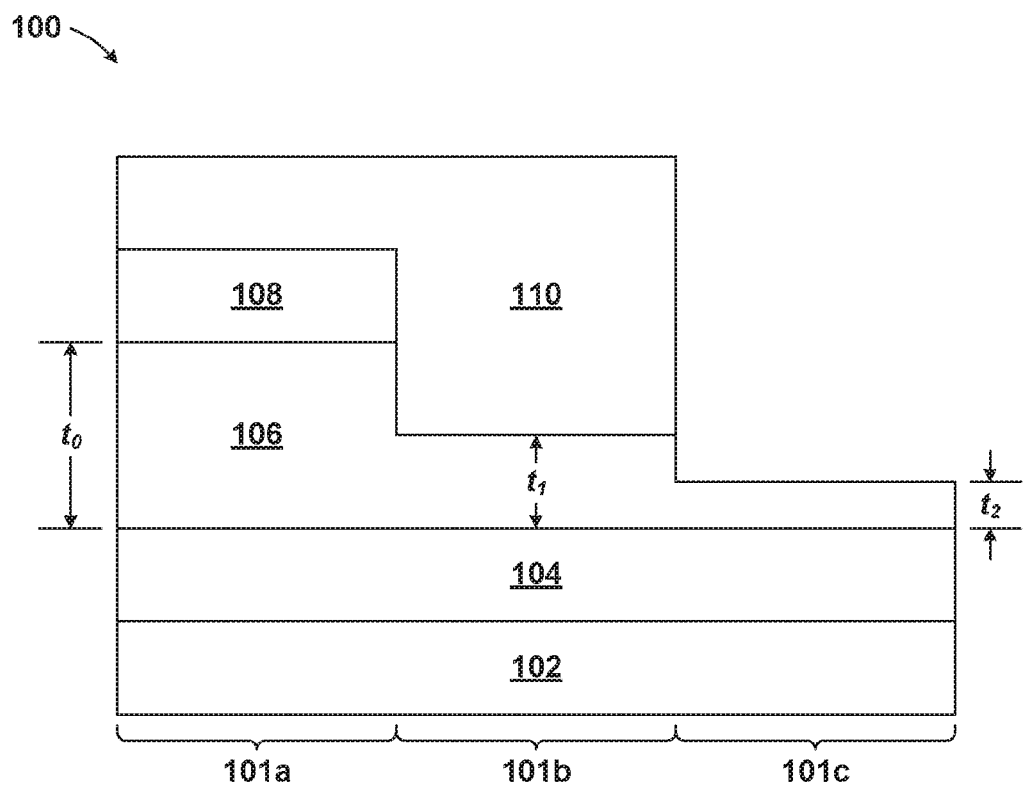
FIG. 3 is a cross section view of the semiconductor structure and illustrates the recessing of a first semiconductor layer in the third region.

With reference to FIG. 3, a demonstrative illustration of the structure 100 is provided during an intermediate step of a method of fabricating FinFETs with different threshold voltages, according to an embodiment. More specifically, the method can include forming and patterning a second mask 110 and recessing a portion of the first semiconductor layer 106 in the third region 101c.

The second mask 110 may be formed on the first semiconductor layer 106 in the second and third regions 101b, 101c and on the first mask 108 in the first region 101a. The second mask 110 may be formed using any deposition technique known in the art, such as, for example, chemical vapor deposition (CVD), plasma enhanced chemical vapor deposition (PECVD), atomic layer deposition (ALD), or physical vapor deposition (PVD). The second mask 110 may include any masking material known in the art, such as, for example, an oxide, silicon nitride ($Si_3N_4$), silicon carbide (SiC), silicon carbon nitride (SiCN), hydrogenated silicon carbide (SiCH), or any other masking material. The second mask 110 may be patterned exposing a top surface of the first semiconductor layer 106 in the third region 101c, while remaining above the first semiconductor layer 106 in the second region 101b and above the first mask 108 in the first region 101a. The second mask 110 may be patterned using any patterning or layer removal technique known in the art, such as, for example, a reactive ion etch (RIE) and/or photolithography.

The first semiconductor layer 106 may be recessed in t the third region 101c using any etching technique known in the art, such as, for example, a reactive ion etch (RIE). The etching technique may etch the first semiconductor layer 106 selective to the second mask 110, such that second mask 110 protects the first semiconductor layer 106 in the first and second regions 101a, 101b. After the first semiconductor layer 106 is recessed, the first semiconductor layer 106 will have a second recessed thickness ($t_2$) in the third region 101c. The second recessed thickness ($t_2$) can range from about 1 nm to about 200 nm, however, other thicknesses may be used. In an embodiment, the second recessed thickness ($t_2$) is about 10 nm.

Figure 4:
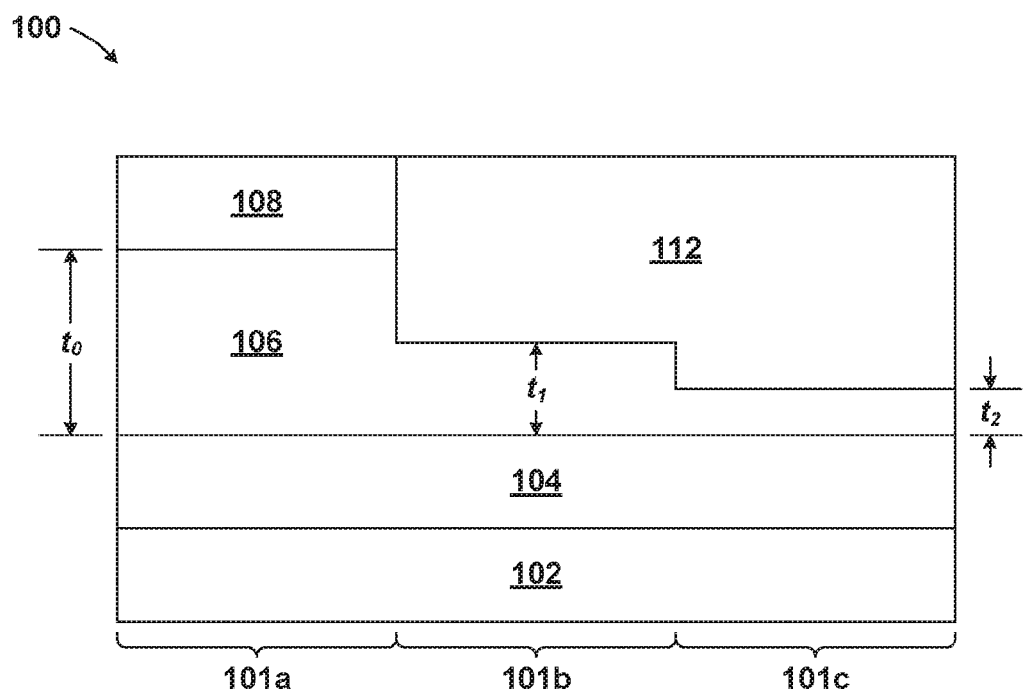
FIG. 4 is a cross section view of the semiconductor structure and illustrates the formation of a second semiconductor layer in the second and third region.

With reference to FIG. 4, a demonstrative illustration of the structure 100 is provided during an intermediate step of a method of fabricating FinFETs with different threshold voltages, according to an embodiment. More specifically, the method can include forming a second semiconductor layer 112 on the first semiconductor layer 106 in the second and third regions 101b, 101c.

The second semiconductor layer 112 may be formed on the first semiconductor layer 106 using any deposition technique known in the art, such as, for example, epitaxial growth. The second semiconductor layer 112 may be any semiconductor material known in the art, such as, for example, silicon, germanium, or SiGe. In an embodiment, the second semiconductor layer 112 is SiGe with a germanium concentration between 10 to 50 percent. A top surface of the second semiconductor layer 112 may be planarized using any planarization technique known in the art, such as, for example, chemical-mechanical polishing (CMP).

Figure 5:
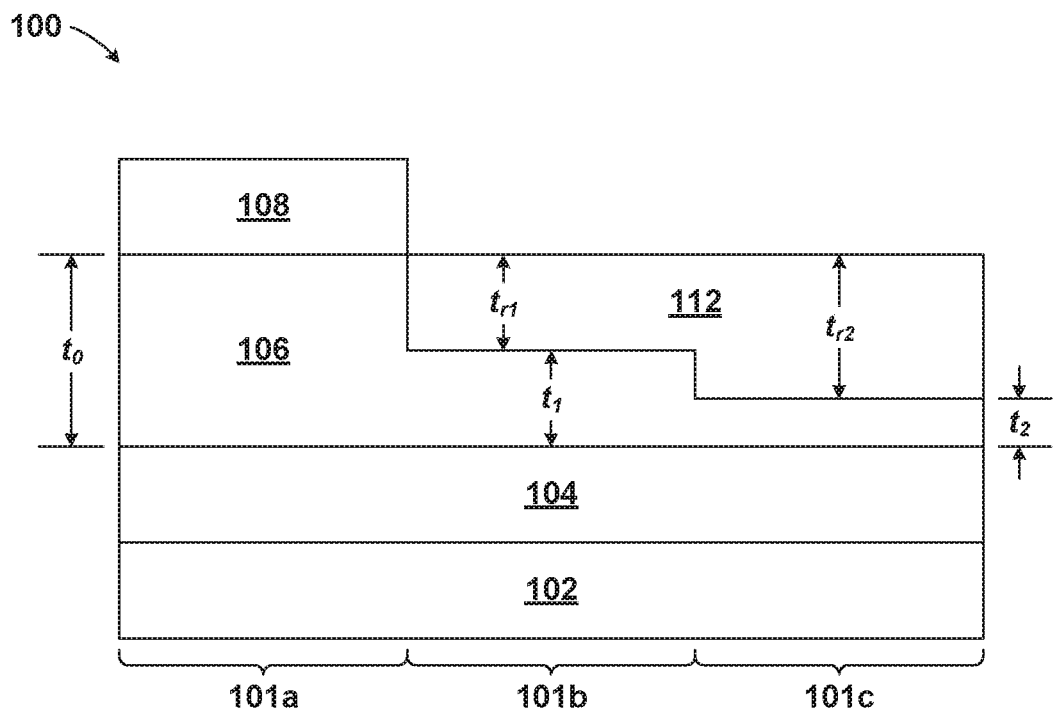
FIG. 5 is a cross section view of the semiconductor structure and illustrates the recessing of the second semiconductor layer in the second and third region.

With reference to FIG. 5, a demonstrative illustration of the structure 100 is provided during an intermediate step of a method of fabricating FinFETs with different threshold voltages, according to an embodiment. More specifically, the method can include recessing the second semiconductor layer 112 in the second and third regions 101b, 101c.

The second semiconductor layer 112 may be recessed using any etching technique known in the art, such as, for example, a reactive ion etch (RIE). As a result, the second semiconductor layer 112 may have a top surface in the second and third regions 101b, 101c that is coplanar with a top surface of the first semiconductor layer 106 in the first region 101a. The second semiconductor layer 112 may have a first remaining thickness ($t_{r1}$) equal to ($t_0-t_1$) in the second region 101b and a second remaining thickness ($t_{r2}$) equal to ($t_0-t_2$) in the third region 101c.

Figure 6:
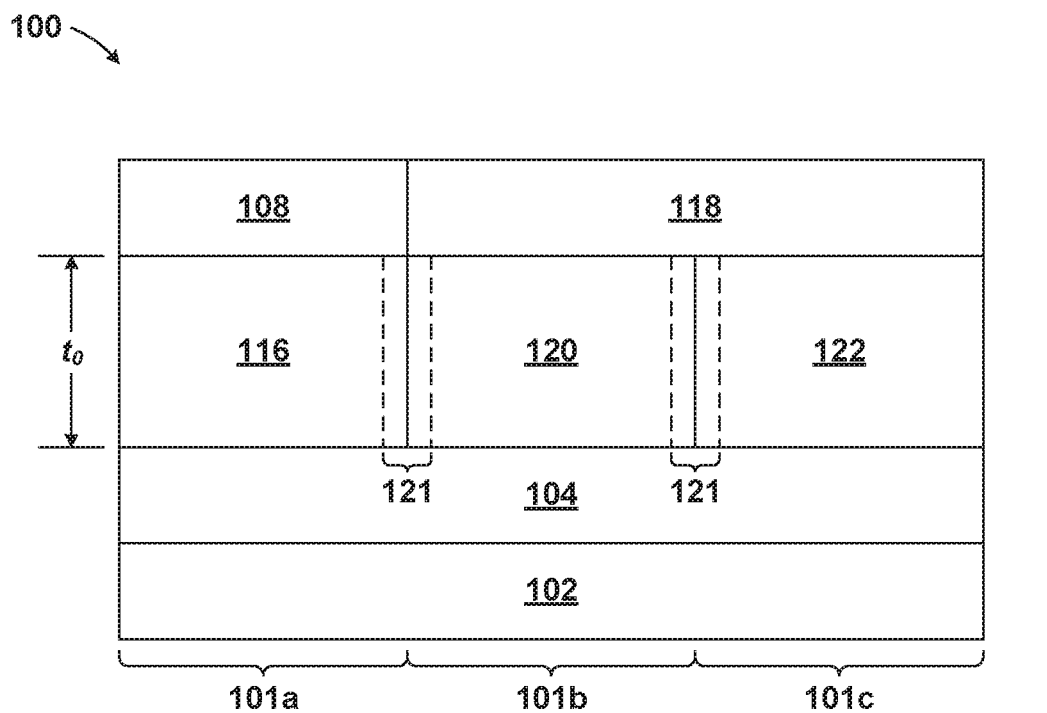
FIG. 6 is a cross section view of the semiconductor structure and illustrates the merging of the first and second semiconductor layers in the second and third regions.

With reference to FIG. 6, a demonstrative illustration of the structure 100 is provided during an intermediate step of a method of fabricating FinFETs with different threshold voltages, according to an embodiment. More specifically, the method can include merging the first and second semiconductors 106, 112 in the second and third regions 101b, 101c. The merging process will vertically merge semiconductor layers in each region. The resulting composition will depend on the amount of each material being merged (i.e., depending on the thickness of the semiconductor layers being merged and the Ge concentration of semiconductor 112).

The merging process will merge the first semiconductor layer 106 and the second semiconductor layer 112 in each region having the second semiconductor layer 112. The first semiconductor layer 106 will remain unmerged in regions that do not have the second semiconductor layer 112. For example, the first semiconductor 106 will be an unmerged semiconductor 116 in the first region 101a, a first merged semiconductor 120 will be formed in the second region 101b, and a second merged semiconductor 122 will be formed in the third region 101c. Depending on the merging process used, a gradient region 121 may be formed along shared sides of the unmerged semiconductor 116, the first merged semiconductor 120, and the second merged semiconductor 122.

The conversion process may include any merging process known in the art, such as, for example, an annealing, oxidation, and/or condensation process. The conversion of the semiconductor layers in the second region 101b can be performed at the same time as the conversion of the semiconductor layers in the third region 101c, however, the regions may be converted during separate merging steps. In an embodiment, the semiconductor layers in the second and third regions 101b, 101c are converted during the same conversion process.

In an embodiment, a thermal annealing process is used to merge the first and second semiconductor layers 106, 112. The anneal process can be a furnace anneal, rapid thermal anneal, and/or flash anneal process under inert gas ambient. The anneal temperature can range from 600 degrees to 1300 degrees Centigrade. The anneal time can range from 1 millisecond to 2 hours, depending on the anneal temperature. Higher anneal temperatures may require shorter anneal times. A typical anneal condition may be about 30 minutes at 1000° C.

In an alternative embodiment, an oxidation process may be used. The oxidation process may include, annealing in oxidizing ambient. The annealing induces diffusion of germanium atoms towards the first semiconductor 106 in the second and third regions 101b, 101c, where silicon atoms in the first and second semiconductor layers 106, 112 diffuse onto the top surface of the second semiconductor 112 and form an oxide layer 118. In an embodiment, the oxide layer 118 is $SiO_2$. The Ge-condensation process may be performed by oxidizing the structure 100 in oxygen atmosphere at a high temperature, such as, for example, above 1000° C.

In an embodiment, the first semiconductor 106 is silicon and the second semiconductor 112 is SiGe have a germanium concentration of about 30 percent. The merged semiconductors will have a germanium concentration equal to the remaining thickness of SiGe (i.e., $t_{r1}$ and $t_{r2}$ for the second and third regions 101b, 101c, respectively) multiplied by the germanium concentration in the SiGe, divided by the starting thickness.

First merged semiconductor 120: Final Ge %=$(t_0-t_1)\times$(initial Ge %)/$t_0$ (40 nm−20 nm)×(0.30)/40 nm=15%

Second merged semiconductor 122: Final Ge %=$(t_0-t_2)\times$(initial Ge %)/$t_0$ (40 nm−10 nm)×(0.30)/40 nm=22.5%

Unmerged semiconductor 116: Final Ge %=0

After the merging process, the unmerged semiconductor 116, the first merged semiconductor 120, and the second merged semiconductor 122 can have a conformal thickness equal to about the starting thickness (to). In an embodiment, the unmerged semiconductor 116 is silicon with a thickness of about 40 nm, resulting in a material having a higher threshold voltage than the materials formed in the second and third regions 101b, 101c. The first merged semiconductor 120 is SiGe with a germanium concentration of about 15% and a thickness of about 40 nm, resulting in a material having a medium threshold voltage compared to the materials in the first and third regions 101a, 101c. The second merged semiconductor 122 is SiGe with a germanium concentration of about 22.5% and a thickness of about 40 nm, resulting in a material having the lowest threshold voltage of the three regions.

Figure 7:
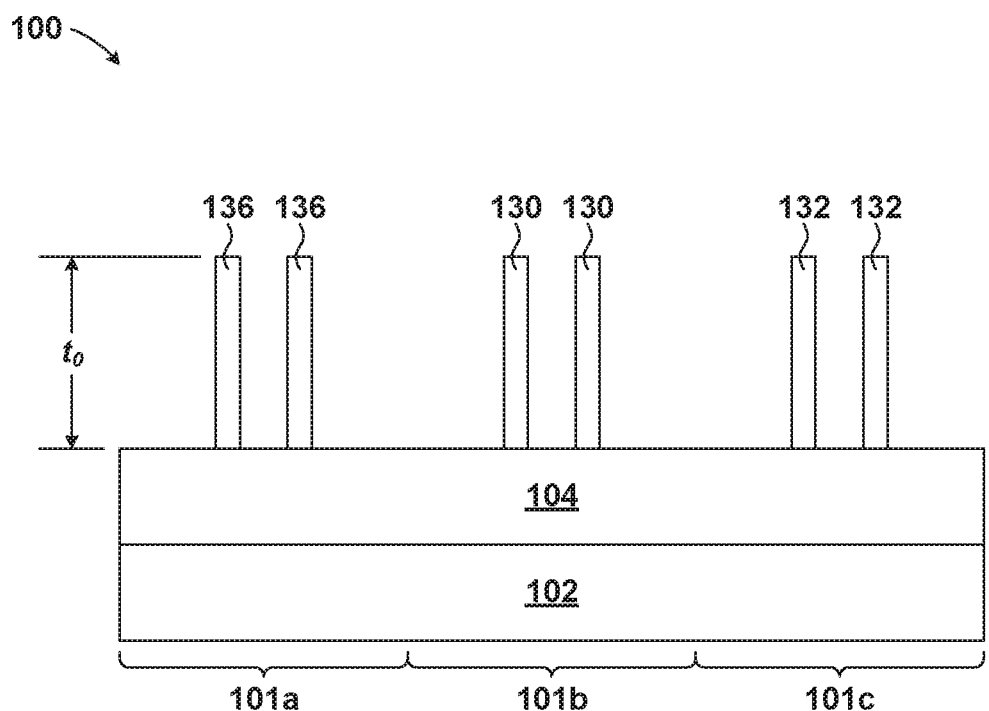
FIG. 7 is a cross section view of the semiconductor structure and illustrates the formation of unmerged fins in the first region, first merged fins in the second region, and second merged fins in the third region.
Figure 8:
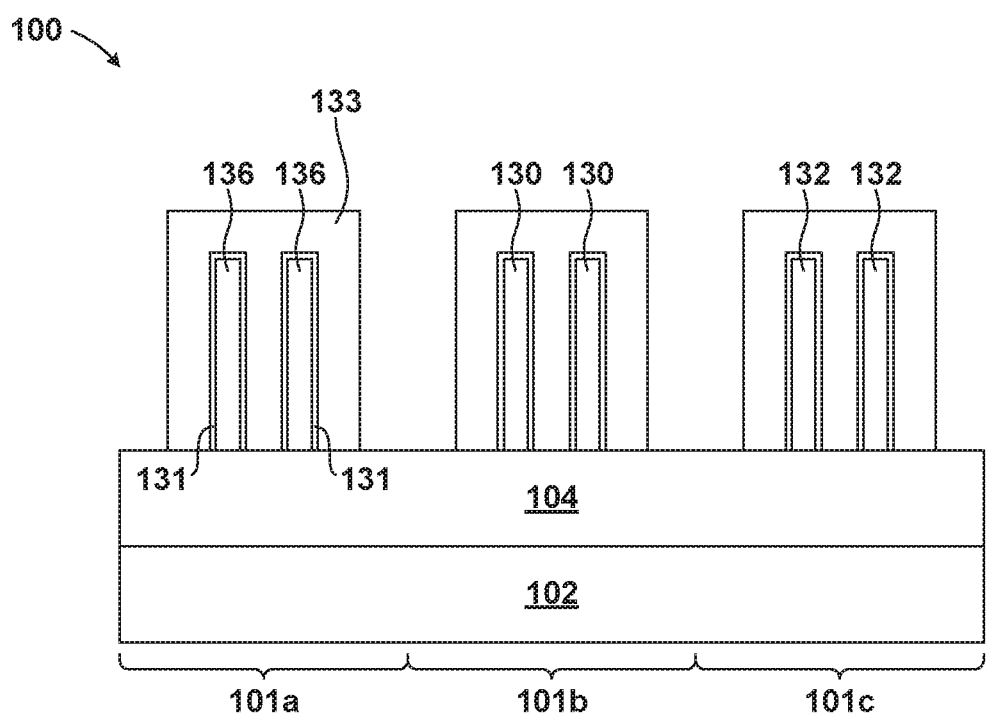
FIG. 8 is a cross section view of the semiconductor structure and illustrates the formation of a metal gate on the unmerged fins, the first merged fins, and the second merged fins.

With reference to FIGS. 7 and 8, a demonstrative illustration of the structure 100 is provided during an intermediate step of a method of fabricating FinFETs with different threshold voltages, according to an embodiment. More specifically, the method may include forming high Vt fins 106, regular Vt fins 120, and low Vt fins 122. It should be noted, the high Vt fins 106 may be referred to as unmerged fins or first fins, the regular Vt fins 120 may be referred to as first merged fins or second fins, and the low Vt fins 122 may be referred to as second merged fins or third fins.

The high Vt fins 106, the regular Vt fins 120, and the low Vt fins 122 may be formed from the unmerged semiconductor 116, the first merged semiconductor 120 and the second merged semiconductor 122, respectively. The high Vt fins 106, the regular Vt fins 120, and the low Vt fins 122 may be formed using any fin formation technique known in the art, such as, for example, a mask and etch process including, for example, a photoresist layer and a reactive-ion etch (RIE). During the formation of the fins, the gradient regions 121 may be removed, such that the resulting fins have a substantially uniform composition in each of the regions.

A dielectric layer 131 may be formed on the fins using any deposition method known in the art. The dielectric layer 131 may be a high-k dielectric material. The dielectric material may be formed on exposed sides of the high Vt fins 106, the regular Vt fins 120, and the low Vt fins 122.

A metal gate 133 may be formed over sets of fins in each region using any deposition technique known in the art, such as, for example, atomic layer deposition (ALD), chemical vapor deposition (CVD), atomic layer deposition (PVD), molecular beam deposition (MBD), pulsed laser deposition (PLD), or liquid source misted chemical deposition (LSMCD). The metal gate 133 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC, or any combination therein.

It may be beneficial to have fins with different germanium fractions (i.e., having different threshold voltages). One benefit to of forming sets of fins with different germanium fractions from a single semiconductor layer (e.g., the semiconductor layer 106) is to save cost and processing time. The fins can be part of a semiconductor device, such as, for example, a tri-gate device. Devices having high threshold voltages are suitable for low-power, while devices having low threshold voltages are suitable for high-speed. It is important for a technology to have devices with different threshold voltages in order to meet the diverse range of requirements for speed and power consumption for various circuit blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a plurality of fins having different threshold voltages comprising:
   providing a first semiconductor layer in a plurality of regions, wherein the first semiconductor layer has a starting thickness across the plurality of regions;
   recessing the first semiconductor layer in a first recessed region, wherein the first semiconductor layer has a first recessed thickness in the first recessed region;
   recessing the first semiconductor layer in a second recessed region, wherein the first semiconductor layer has a second recessed thickness in the second recessed region, and the second recessed thickness is less than the first recessed thickness;
   forming a second semiconductor layer on the first semiconductor layer in the first recessed region and in the second recessed region;
   merging the first semiconductor layer and the second semiconductor layer in regions having the second semiconductor layer, wherein a first merged semiconductor is formed in the first recessed region and a second merged semiconductor is formed in the second recessed region; and
   forming first concentration fins from the first merged semiconductor and second concentration fins from the second merged semiconductor.

2. The method of claim 1, wherein the first semiconductor layer includes an unmerged semiconductor in an unmerged region, the unmerged region is adjacent to recessed regions having the first semiconductor layer and the second semiconductor layer, further comprising:
   forming unmerged fins from the unmerged semiconductor in the unmerged region, wherein the unmerged fins are adjacent to the first concentration fins and the second concentration fins.

3. The method of claim 2, wherein the unmerged semiconductor, the first merged semiconductor, and the second merged semiconductor each have a thickness substantially equal to the starting thickness.

4. The method of claim 1, wherein the unmerged fins have a higher threshold voltage than both the first concentration fins and the second concentration fins, and the first concentration fins have a higher threshold voltage than the second concentration fins.

5. The method of claim 1, wherein the first merged semiconductor and the second merged semiconductor each have a substantially uniform composition.

6. The method of claim 1, wherein the first semiconductor layer is silicon and the second semiconductor layer is SiGe.

7. The method of claim 6, wherein the unmerged fins are silicon fins, the first concentration fins and the second concentration fins are SiGe fins, and wherein the first concentration fins have a lower germanium concentration than the second concentration fins.

8. The method of claim 1, wherein the second semiconductor has a germanium concentration of 30 percent, the first concentration fins have a germanium concentration of 15 percent, and the second concentration fins have a germanium concentration of 22.5 percent.

9. The method of claim 1, wherein merging the first semiconductor layer and the second semiconductor layer includes an annealing process.

10. The method of claim 1, wherein merging the first semiconductor layer and the second semiconductor layer includes an oxidation process.

11. A method of forming a plurality of fin regions having different threshold voltages, the method comprising:

providing a first semiconductor layer on an insulator layer in the plurality of fin regions, wherein the first semiconductor layer has a starting thickness across the plurality of fin regions, wherein the plurality of fin regions include at least a first region and a second region;

recessing the first semiconductor layer in recessed regions, wherein the recessed regions include at least the first region and the second region, wherein the first semiconductor layer has a first recessed thickness in the first region and a second recessed thickness in the second region, and the first recessed thickness is larger than the second recessed thickness;

forming a second semiconductor on the first semiconductor layer in the recessed regions; and forming merged semiconductors in the recessed regions by merging the first semiconductor layer with the second semiconductor, wherein a first merged semiconductor is in the first region and a second merged semiconductor is in the second region, and the first merged semiconductor has a different concentration than the second merged semiconductor.

12. The method of claim 11, wherein each of the merged semiconductors have a substantially uniform concentration.

13. The method of claim 11, further comprising:
forming first concentration fins from the first merged semiconductor and second concentration fins from the second merged semiconductor.

14. The method of claim 13, wherein the first semiconductor layer is in an unmerged region adjacent to the recessed regions, further comprising:
forming unmerged fins from the semiconductor layer in the unmerged region.

15. The method of claim 14, wherein the first semiconductor layer in the unmerged region has a thickness substantially equal to the thickness of the first merged semiconductor and the second merged semiconductor.

16. The method of claim 14, wherein the unmerged fins, the first concentration fins, and the second concentration fins each have a different threshold voltage.

17. The method of claim 11, wherein the first semiconductor layer is silicon and the second semiconductor is SiGe.

18. The method of claim 11, wherein the second semiconductor has a germanium concentration of 30 percent.

* * * * *